(12) United States Patent
Regel et al.

(10) Patent No.: US 7,118,782 B2
(45) Date of Patent: Oct. 10, 2006

(54) METHOD FOR MANUFACTURING DIAMOND COATINGS

(75) Inventors: Liya Regel, Potsdam, NY (US); Andre D. Cropper, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 246 days.

(21) Appl. No.: 10/722,309

(22) Filed: Nov. 25, 2003

(65) Prior Publication Data
US 2005/0109282 A1 May 26, 2005

(51) Int. Cl.
*C23C 16/27* (2006.01)
(52) U.S. Cl. .............................. 427/249.8; 427/249.11
(58) Field of Classification Search ............. 427/249.7, 427/249.8, 249.11
See application file for complete search history.

(56) References Cited

U.S. PATENT DOCUMENTS

| | | | | |
|---|---|---|---|---|
| 4,259,090 | A * | 3/1981 | Bovenkerk ................... | 51/309 |
| 4,425,315 | A * | 1/1984 | Tsuji et al. .................. | 423/446 |
| 4,525,179 | A * | 6/1985 | Gigl ............................ | 51/309 |
| 5,340,401 | A * | 8/1994 | Cann ........................... | 118/725 |
| 5,587,207 | A * | 12/1996 | Gorokhovsky ............... | 427/571 |
| 5,863,324 | A | 1/1999 | Kobashi et al. | |
| 5,871,805 | A * | 2/1999 | Lemelson ...................... | 427/8 |
| 5,920,080 | A | 7/1999 | Jones | |
| 6,042,900 | A * | 3/2000 | Rakhimov et al. .......... | 427/577 |
| 6,045,877 | A * | 4/2000 | Gleason et al. ............. | 427/522 |
| 6,198,218 | B1 | 3/2001 | Kobashi et al. | |
| 6,214,706 | B1 * | 4/2001 | Madan et al. ................ | 438/482 |
| 6,525,335 | B1 | 2/2003 | Krames et al. | |
| 6,560,398 | B1 | 5/2003 | Roach et al. | |
| 6,608,449 | B1 | 8/2003 | Fukunaga | |
| 6,882,094 | B1 * | 4/2005 | Dimitrijevic et al. ... | 313/346 R |
| 2003/0108672 | A1 * | 6/2003 | Takagi ..................... | 427/249.8 |
| 2003/0173895 | A1 | 9/2003 | Kato et al. | |
| 2004/0194689 | A1 * | 10/2004 | Sung ........................... | 117/63 |

FOREIGN PATENT DOCUMENTS

JP    08 225394 A    9/1996
WO   WO200181660 A1 *  11/2001

OTHER PUBLICATIONS

A. Gicquel, K. Hassouni, F. Silva and J. Achard, "CVD diamond films: from growth to applications," *Current Applied Physics* 1 (2001), pp. 479-496.
"Diamond Films" Recent Developments, vol. 23, No. 9 of the MRS Bulletin (Sep. 1998), Materials Research Society, Warrendale, Pennsylvania.
L.L. Regel and W.R. Wilcox, "Diamond film deposition by chemical vapor transport," *Acta Astronautica* 48 (2001), pp. 129-144.

(Continued)

*Primary Examiner*—Bret Chen
(74) *Attorney, Agent, or Firm*—Stephen H. Shaw

(57) ABSTRACT

A method of manufacturing diamond coatings, at low temperature and low pressure on a substrate utilizing chemical vapor transport (CVT) comprising the steps of: providing a wire-wrapped graphite assembly component and the substrate into a chamber; filling the chamber with hydrogen; reducing ambient pressure in the chamber to a vacuum and backfilling with hydrogen; sealing the chamber containing hydrogen at a pressure less than 1 atmosphere; and passing electric current through the graphite rod until the substrate is heated within a range of 125° C.–750° C. to produce high-quality diamond at temperatures with exceptional properties.

9 Claims, 4 Drawing Sheets

OTHER PUBLICATIONS

W.L. Wang, K.J. Liao, R.Q. Zhang and C.Y. Kong, "Investigation of organic light emitting devices using boron-doped diamond electrodes," *Materials Science and Engineering* B85 (2001), pp. 169-171.

M.J. Ulczynski, B. Wright and D.K. Reinhard, "Diamond-coated glass substrates," *Diamond and Related Materials* 7 (1998), pp. 1639-1646.

J. Stiegler, A. Bergmaier, J. Michler, Y. von Kaenel, G. Dollinger, E. Blank, "Impurity and defect incorporation in diamond films deposited at low substrate temperatures," *Diamond and Related Materials* 7 (1998), pp. 193-199.

C. Jinsheng, W. Xuejun, Z. Zhihao and Y. Fengyuan, "Nucleation and growth of diamond on silicon substrate coated with polymer," *Thin Solid Films* 346 (1999), pp. 120-124.

Z. Sun, X. Shi, X. Wang, B.K. Tay, H. Yang and Y. Sun, "Morphological features of diamond films depending on substrate temperatures via a low pressure polymer precursor process in a hot filament reactor," *Diamond and Related Materials* 7 (1998), pp. 939-943.

V.J. Trava-Airoldi, B.N. Nobrega, E.J. Corat, E. del Bosco, N.F. Leiter and V. Baranauskas, "Low temperature chemical vapour deposition of diamond on tungsten carbides using $CF_4$ gas doping for machine tool applications", *Vacuum* 46 (1995) 5-8.

L. Dong, B. Ma and G. Dong, "Diamond deposition at low temperature by using $CH_4/H_2$ gas mixture," *Diamond and Related Materials* 11 (2002), pp. 1697-1702.

J. Petherbridge, P.W. May, S.R.J. Pearce, K.N. Rosser and M.N. Ashfold, "Molecular beam mass spectrometry investigations of low temperature diamond growth using $CO_2/CH_4$ plasmas," *Diamond and Related Materials* 10 (2001), pp. 393-398.

I. Schmidt and C. Benndorf, "Low temperature CVD materials: AlZn and glass," *Diamond and Related Materials* 10 (2001), pp. 347-351.

A. Li Tolt, L. Heatherly, R.E. Clausing, R.W. Shaw and C.S. Feigerle, "HFCD of diamond at low substrate and low filament temperatures," pp. 303-311 in *Electrochemical Society Proceedings* vol. 95-4, *Proceedings of the Fourth International Symposium on Diamond Materials*, edited by K.V. Ravi and J.P. Dismukes, The Electrochemical Society, Pennington, NJ (1995).

A. Hatta and A. Hiraki, "Low temperature chemical vapor deposition," pp. 887-899, in *Handbook of Industrial Diamonds and Diamond Films*, edited by M.A. Prelas, G. Popovici and L.K. Bigelow, Marcel Dekker, NY (1998).

J.G. Buijnster, P. Shankar, W.J.P. van Enckevort, J.J. Schermer and J.J ter Meulen, "The effect of nitriding on the diamond film characteristics on chromium substrates," *Diamond and Related Materials* 11 (2002), pp. 1760-1768.

B.V. Spitsyn, "The state of the art in studies of diamond synthesis from the gaseous phase and some unsolved problems," in *Applications of Diamond Films and Related Materials*, edited by Y. Tzeng, M. Yoshikawa, M. Murakami and A. Feldman. Elsevier, Amsterdam (1991), no page numbers.

B.V. Spitsyn, "Crystallization of diamond by the chemical transport reaction: thermodynamics and kinetics," pp. 61-72, in *Electrochemical Society Proceedings* vol. 95-4, *Proceedings of the Fourth International Symposium on Diamond Materials*, edited by K.V. Ravi and J.P. Dismukes, The Electrochemical Society, Pennington, NJ (1995).

L.L. Regel, T. Takagi and W.R. Wilcox, "Centrifugal diamond film processing," pp. 221-227, in *Centrifugal Materials Processing*, edited by L.L. Regel and W.R. Wilcox, Plenum Press, NY (1997).

H.K. Woo, C.S. Lee, I. Bello. St. T. Lee, K.W. Wong and N.B. Wong, "Oriented diamond growth on silicon (111) using a solid carbon source," *J. Applied Physics* 83 (1998), pp. 4187-4192.

S.D. Shin, N.M. Hwang and D.Y. Kim, "High rate of diamond deposition through graphite etching in a hot filament CVD reactor," *Diamond and Related Materials* 11 (2002), pp. 1337-1343.

L.L. Regel and W.R. Wilcox, "Selective patterned deposition of diamond using a new technique," *J. Mat. Sci. Lett.* 18 (1999), pp. 427-430.

Y. Takagi, L.L. Regel and W.R. Wilcox, "New method for diamond film deposition under different gravity conditions," *Trans. Mat. Res. Soc. Japan* 24 (1999), pp. 513-518.

L.L. Regel and W.R. Wilcox, "Deposition of diamond on graphite and carbon felt from graphite heated in hydrogen at low pressure," *J. Mat. Sci. Lett.* 19 (2000), pp. 455-457.

\* cited by examiner

METHOD FOR MANUFACTURING DIAMOND COATINGS

FIELD OF THE INVENTION

The present invention relates to a method for self-regulating manufacturing of diamond coatings at low temperature and low pressure in a sealed chamber.

BACKGROUND OF THE INVENTION

The earliest methods for the manufacturing of diamond required high temperatures and pressures. In the early 1980's it was discovered that diamond could be deposited by chemical vapor deposition (CVD) at a low pressure, approximately 0.1 atmosphere for example, Sho JP5927754 in 1983 and JP613320 in 1984, Kobashi U.S. Pat. No. 5,863,324 in 1999. The subsequently developed CVD methods all require the presence of flowing hydrogen gas containing a carbon-containing species such as methane ($CH_4$), a hot tungsten filament or a plasma generator, and a nearby substrate held at high temperature, approximately 750 to 950° C. for high-quality diamond which is typically defined by Raman spectroscopy to have a well defined single sharp peak at 1332 $cm^{-1}$ and diamond-like carbon, a completely different material, that have a distinctive broad band in the range of 1357 to 1580 $cm^{-1}$ with a peak around 1555 $cm^{-1}$. These CVD methods all suffer from several problems:

1. The deposition rate is low, typically on the order of 1 µm/h, causing the cost to be too high for many applications.
2. The flowing gas system requires gas supplies, control meters, a continuously operating vacuum pump, and often a plasma generator. The equipment is costly and the methods are wasteful of feed materials and electricity, all contributing to the high cost of CVD methods.
3. The high temperature required for the substrate leads to chemical reactions of the gas with some substrates. For example, attempted growth on materials containing iron, nickel or cobalt yields poor-quality, non-adhering diamond on top of porous graphite. To avoid such problems, buffer layers of different compositions must be used.
4. The high temperature required for deposition also leads to large stresses, which, in turn, caused delamination, warping, and cracking upon cooling to room temperature. This stress comes about primarily because the thermal contraction of diamond differs from that of the substrate, combined with the large temperature change upon cooling.
5. The high temperature required for deposition by CVD has also made it impossible to deposit diamond on many materials that would be destroyed by this temperature. This restriction included all polymeric materials, as well as many semiconductor and device structures.
6. Another approach to the problem in 5 is to use a two-step process wherein the CVD diamond is first deposited at temperatures above 800° C. and then removed, transferred and attached to the final substrate.

There is need for an improved method for manufacturing diamond coatings that will overcome the problems noted above to reduce cost, increase growth rate, reduce waste, reduce components, increase material quality, reduce stress on substrates and coatings, and create the opportunity to deposit on polymeric materials. The deposition of diamond by a chemical vapor transport method at low temperature and low pressure provides such coatings. Although the exceptional properties of diamond are well known, the present invention provides the first means to deposit diamond at low temperature and pressure. Additional applications hitherto not possible because of high deposition temperatures also suggest themselves; for example, the use of a diamond substrate in display devices and the fabrication of transistors made from diamond.

SUMMARY OF THE INVENTION

The present invention is directed to overcoming the problems set forth above, by providing a method of forming tightly adhering high-quality diamond coatings at low temperatures and low pressure on a substrate, that includes the steps of providing a graphite rod and high-melting metal wire and substrate into a chamber; alternately reducing the pressure in the chamber to a vacuum and backfilling to about 1 atmosphere with hydrogen; backfilling the chamber with hydrogen gas below 1 atmosphere and sealing the chamber; and applying electric current to the graphite rod until the substrate is heated to within a range of 125° C. to 750° C.

ADVANTAGEOUS EFFECT OF THE INVENTION

The present invention has the advantage in that it reduces the overall cost to manufacture diamond coatings, increases the growth rate, reduces waste, reduces the number of components needed, increases the material quality, eliminates stress on substrates and coatings, and creates the opportunity to deposit on polymeric materials. This low-temperature low-pressure manufacturing method for diamond can now be achieved on many substrates that hitherto had required an intermediate layer to avoid reaction of the deposition gases with the substrate, e.g., reaction of methane with steel to form iron carbide, and avoids the large stresses that develop when a diamond-substrate system is cooled from a high deposition temperature. Thereby, adherent crack-free deposits can be obtained on many substrate materials for the first time. In particular, it emphasizes a method proven to achieve low temperature diamond deposition and makes possible new applications for diamond coatings that were hitherto impossible.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
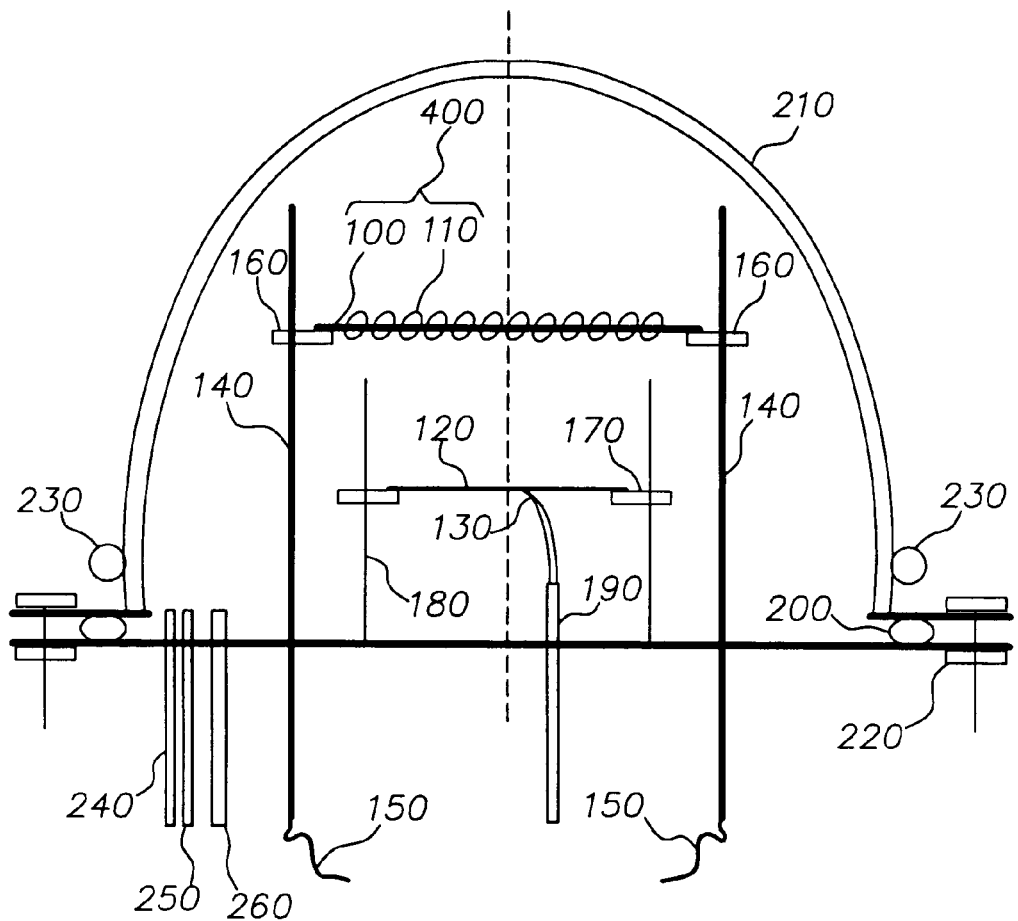
FIG. 1 is a side illustration of the CVT apparatus used here for low-temperature and low-pressure diamond deposition according to the present invention. It consists of the following components; graphite rod, high-melting metal wire, substrate, thermocouple, feed-through poles, variable voltage power supply wires, height adjustment device, substrate holder, substrate height adjustment pole, thermocouple holder, O-ring, chamber cover, cooling water hose, chamber bolts, hydrogen tube, air tube, and vacuum tube.

The low-temperature low-pressure diamond manufacturing process is best understood by reference to FIG. 1. It is a Chemical Vapor Transport (CVT) technique rather than being a CVD technique as with the prior art, because carbon is transported in a sealed chamber rather than being introduced via a hydrocarbon in a flowing gas. A key new feature permitting low-temperature low-pressure diamond deposition is to wrap the graphite rod (100) with a high-melting metal wire (110). In our experiments, platinum has proved particularly beneficial. The substrate (120) is placed some distance from the graphite rod (100) so as to permit the graphite to operate at a sufficiently high temperature to produce the diamond precursor chemicals while maintaining the substrate (120) at the desired low temperature. This substrate may be below the graphite rod (100), above the graphite rod (100), beside it, or surrounding it. A thermocouple (130) is placed on the opposite side of the substrate and in contact with it. The water-cooled chamber cover (210) is placed over this assembly and bolted to the bottom plate with a rubber o-ring (200) in the flange so as to make the chamber gas tight. The chamber is evacuated for an hour or more with a vacuum tube (260) connected to a vacuum pump (not shown). A valve (not shown) is closed in the vacuum tube (260) and a valve (not shown) in the hydrogen tube (240) is opened to admit hydrogen gas to approximately one atmosphere pressure within the chamber. The pressure is read via a pressure gauge (not shown) or transducer (not shown) connected to air tube (250). The chamber is alternately evacuated and filled with hydrogen so as to flush out traces of air and moisture. Finally the chamber is filled with hydrogen to the desired pressure, approximately 0.1 atmosphere, and the valve to the hydrogen supply closed. At this time the chamber is completely sealed and is open only to the pressure gauge. Electric power is gradually applied to the graphite rod (100) through the lead in the graphite feed-through poles (140). The voltage and current are slowly increased until thermocouple (130) indicates that the desired substrate temperature has been reached. The graphite temperature may be read by an optical pyrometer through a view window (not shown) in the chamber cover (210). During a deposition run, which may be minutes to days in length, many parameters are monitored, including pressure, substrate temperature, and the voltage and current to the graphite rod. Typically, negligible variations in these parameters are detected. At the completion of a deposition run, the power to the graphite is switched off. After cooling has taken place for an hour or more, air is admitted to the chamber through the air tube (250) line and then the chamber is opened, and the substrate removed for study.

The ability of the above CVT apparatus and technique to manufacture diamond at low temperature and low pressure, down to 125° C., was demonstrated on sheets of two different polymers—Polyethylene Terephthalate (known as PET, Dacron, Mylar, etc.) and Polyethylene Naphthalate (known as PEN, Kaladex, Kalidar). PET shrinks significantly and is degraded above 150° C., while PEN degrades above 190° C. There was no degradation or damage apparent on these plastics resulting from the diamond manufacturing method presented within. A variety of morphologies were produced, including continuous films and isolated faceted crystals. The deposits were tightly adherent and could not be removed by adhesive tape or scratching with a fingernail. Energy dispersive x-ray spectrometry verified that the deposits contained only carbon, while micro-Raman spectroscopy confirmed that they were high-quality diamond with a 1330 nm peak. Earlier experiments in this apparatus, without wire wound on the graphite rod, demonstrated diamond deposition on silicon, molybdenum, copper, gold, graphite, carbon felt, fused silica, and optical communications fibers. Selective deposition was obtained on a copper pattern on oxidized silicon; i.e. nucleation and growth occurred only on the copper.

Figure 2:
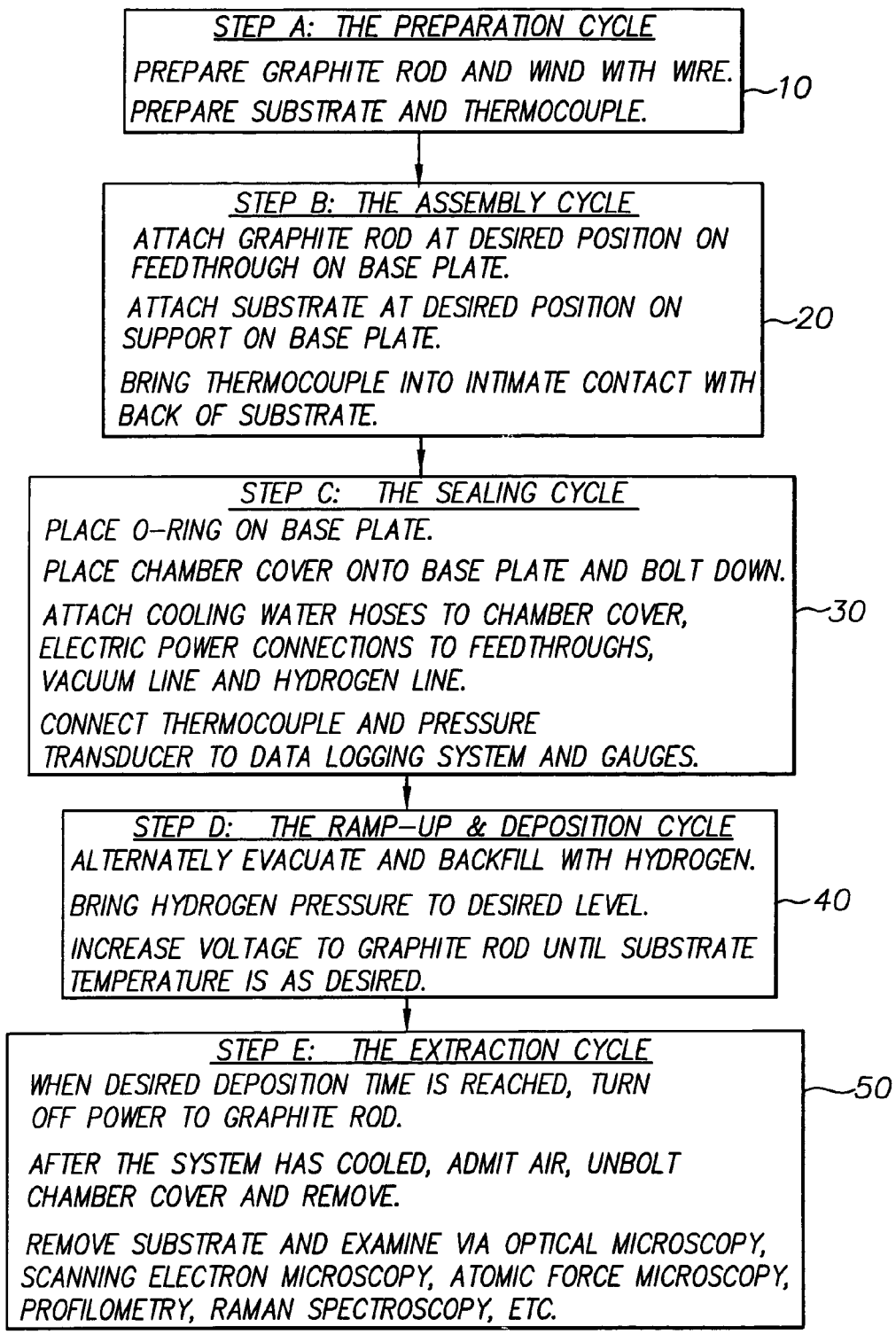
FIG. 2 is a flow chart showing the manufacturing steps of the present invention.

In step A—The Preparation Cycle (10) in FIG. 2, a graphite rod (100) is machined to desired dimensions from a block of high-purity graphite from a commercial supplier. It is cleaned by rinsing with methanol and then dried. It is wrapped with the desired high-melting metal wire (110), typically platinum, to form a single wire-wrapped graphite assembly component (400). In addition, the substrate (120) is prepared by rinsing in methanol and drying. To increase the nucleation density (particles/area) of diamond, a substrate is sometimes scratched with diamond powder by suspending it in a suspension of diamond powder in an ultrasonic bath. (This is not necessary to obtain diamond, but only in some cases to increase the number of diamond particles per unit area.) A thermocouple (120) is formed by making a junction between individual wires purchased commercially.

In step B—The Assembly Cycle (20) of FIG. 2, the graphite rod (100) wrapped with high-melting metal wire (110) is firmly attached at the ends to the two feed-through poles (140), which are connected outside the chamber to a variable voltage power supply that includes voltage and current measuring meters by the variable voltage power supply wires (150). The height adjusting devices (160) for connecting the wire-wrapped graphite assembly component (400) can easily be slid along the graphite feed-through poles (140) to permit adjustment of the spacing between wire-wrapped graphite assembly component (400) and substrate (120). The substrate (120) is attached to the substrate height adjustment poles (180) by substrate holder (170). Again, this substrate holder (170) can easily be moved up and down the substrate height adjustment poles (180). The substrate height adjustment poles (180) are actually placed at 90° from the graphite feed-through poles (140), so that substrate (120) is crossways to the wire-wrapped graphite assembly component (400). Thus, the substrate (120) can be placed above the wire-wrapped graphite assembly component (400) rather than below as shown in FIG. 1. The positions of the wire-wrapped graphite assembly component (400) and the substrate (120) in the chamber are relative to one another and strongly influence the type of deposit obtained, with determination of the optimal positions requiring experimentation. After the substrate (120) is placed in its desired position, the thermocouple (130) is moved so that its junction is in contact with the side of the substrate opposite to wire-wrapped graphite assembly component (400). The thermocouple (130) wires are attached to the thermocouple holder (190) that feeds through to the external measurement electronics that convert the millivolt signal to temperature.

In step C—The Sealing Cycle (30) in FIG. 2, the chamber is assembled. O-ring (200), typically of silicone rubber, is placed in a groove in the base plate. The chamber cover (210), also containing a groove for o-ring (200), is lowered such that o-ring (200) is aligned in its grooves. The chamber bolts (220) are inserted and tightened to compress the o-ring (200) so that the chamber is gas tight. The cooling water hoses (230) are connected to chamber cover (210) and the cooling water turned on. If not already in place, the electric power system is connected to variable voltage power supply wires (150), the thermocouple electronics system is connected to the thermocouple holder (190), the hydrogen gas line to the hydrogen tube (240), the pressure transducer and air line connected to the air tube (250), and the vacuum pump to vacuum tube (260).

In step D—The Ramp-up and Deposition Cycle (40) in FIG. 2, the sealed chamber is evacuated by opening the valve on the vacuum tube (240) to the vacuum pump while making certain the valves are closed to the hydrogen supply and to air. After an hour or more under vacuum the valve to the vacuum pump is closed while that to the hydrogen supply is opened until the pressure in the chamber is approximately one atmosphere. This evacuation and flushing with hydrogen is repeated three times. Finally, the chamber is backfilled with hydrogen to the desired deposition pressure, approximately 0.1 atmosphere. The voltage to the wire-wrapped graphite assembly component (400) is slowly increased until thermocouple (130) reads the desired temperature, here as low as 125° C. During the subsequent run, the pressure, thermocouple (130) temperature, and current and voltage to the wire-wrapped graphite assembly component (400) are either recorded at intervals either manually or with a data-logging system.

In step E—The Extraction Cycle (50) in FIG. 2, the voltage to the wire-wrapped graphite assembly component (400) is turned off when the deposition time has reached the desired length, ranging from 45 minutes to several hours. After the deposition chamber has cooled for an hour or more, air is admitted through the air tube (250) until the pressure inside and outside the chamber are the same. The chamber bolts (220) are removed and chamber cover (210) is lifted off the base plate. The substrate (120) is carefully removed for characterization by optical microscopy, scanning electron microscopy, energy dispersive x-ray spectrometry, atomic force microscopy, profilometry, Raman spectroscopy, etc.

Figure 3:
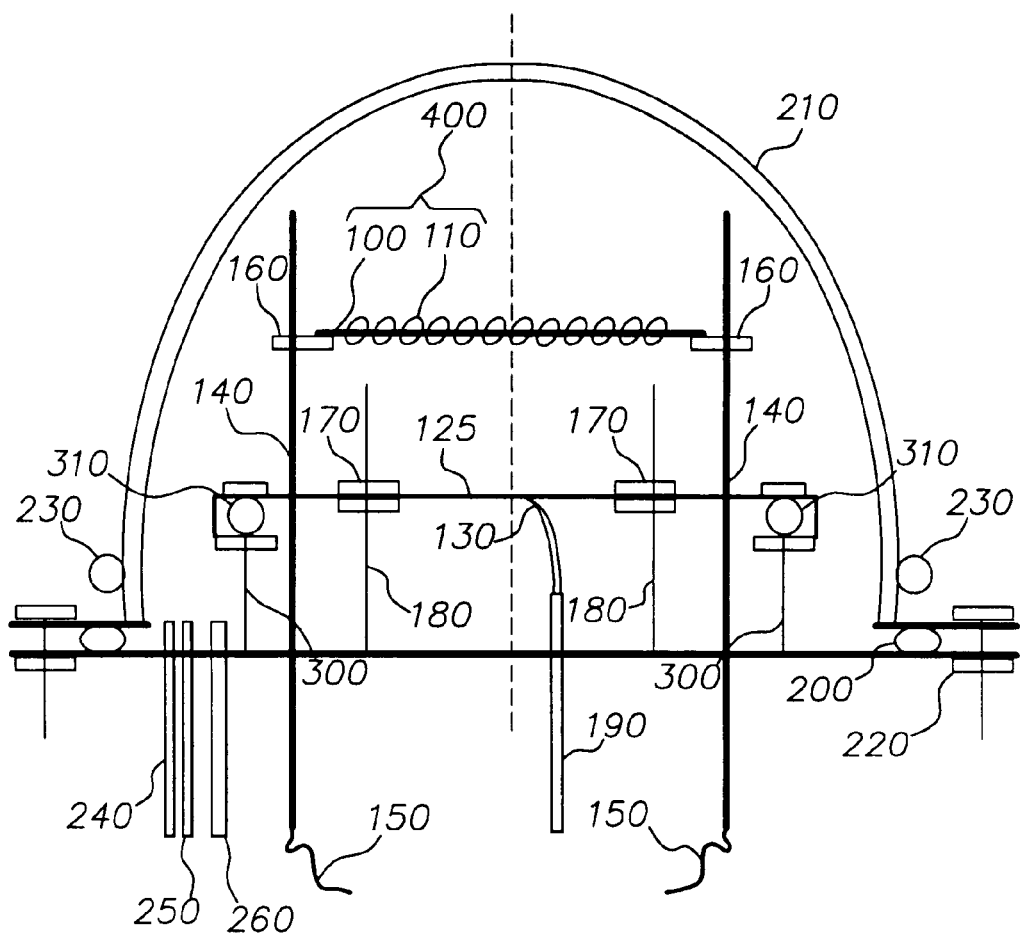
FIG. 3 is a side illustration of the roll-to-roll CVT apparatus used here for low-temperature and low-pressure diamond deposition using a continuous flow process according to the present invention. It consists of the following components; graphite rod, high-melting metal wire, substrate, thermocouple, feed-through poles, variable voltage power supply wires, height adjustment device, substrate holder, substrate height adjustment pole, thermocouple holder O-ring, chamber cover, cooling water hose, chamber bolts, hydrogen tube, air tube, vacuum tube, roll-to-roll holder and roll-to-roll case holder.

The substrates used in FIG. 2, steps A through E can either be a rigid substrates such as but not limited to, glass, silicon, molybdenum, gold or copper or a flexible substrates such as but not limited to polymers. These flexible substrates (125) would be mounted as shown in FIG. 3 within the roll-to-roll case holder (310) which is held in place by the roll-to-roll holder (300) and placed some distance from the wire-wrapped graphite assembly component (400) so as to permit the graphite to operate at a sufficiently high temperature to produce the diamond precursor chemicals while maintaining the flexible substrate (125) at the desired low temperature. This substrate may be below the graphite rod (100), above the graphite rod (100), beside it, or surrounding it. The flexible substrate (125) is attached to the substrate height adjustment poles (180) by substrate holder (170). Again, this substrate holder (170) can easily be moved up and down the substrate height adjustment poles (180). The substrate height adjustment poles (180) are actually placed at 90° from the graphite feed-through poles (140), so that the flexible substrate (125) is crossways to the wire-wrapped graphite assembly component (400). Thus, the flexible substrate (125) can be placed above the wire-wrapped graphite assembly component (400) rather than below as shown in FIG. 3. The positions of the wire-wrapped graphite assembly component (400) and the flexible substrate (125) in the chamber are relative to one another and strongly influence the type of deposit obtained, with determination of the optimal positions requiring experimentation.

The temperature required for diamond deposition in the foregoing steps above were above that required for the applications described here. A lengthy series of experiments revealed the conditions required for diamond deposition at temperatures required for organic compounds. The deposition temperature could be lowered significantly by moving the surface to be coated farther away from the graphite rod, lowering the temperature of the graphite rod, lowering the hydrogen pressure in the chamber, and wrapping the graphite rod with a catalytic metal wire.

Figure 4:
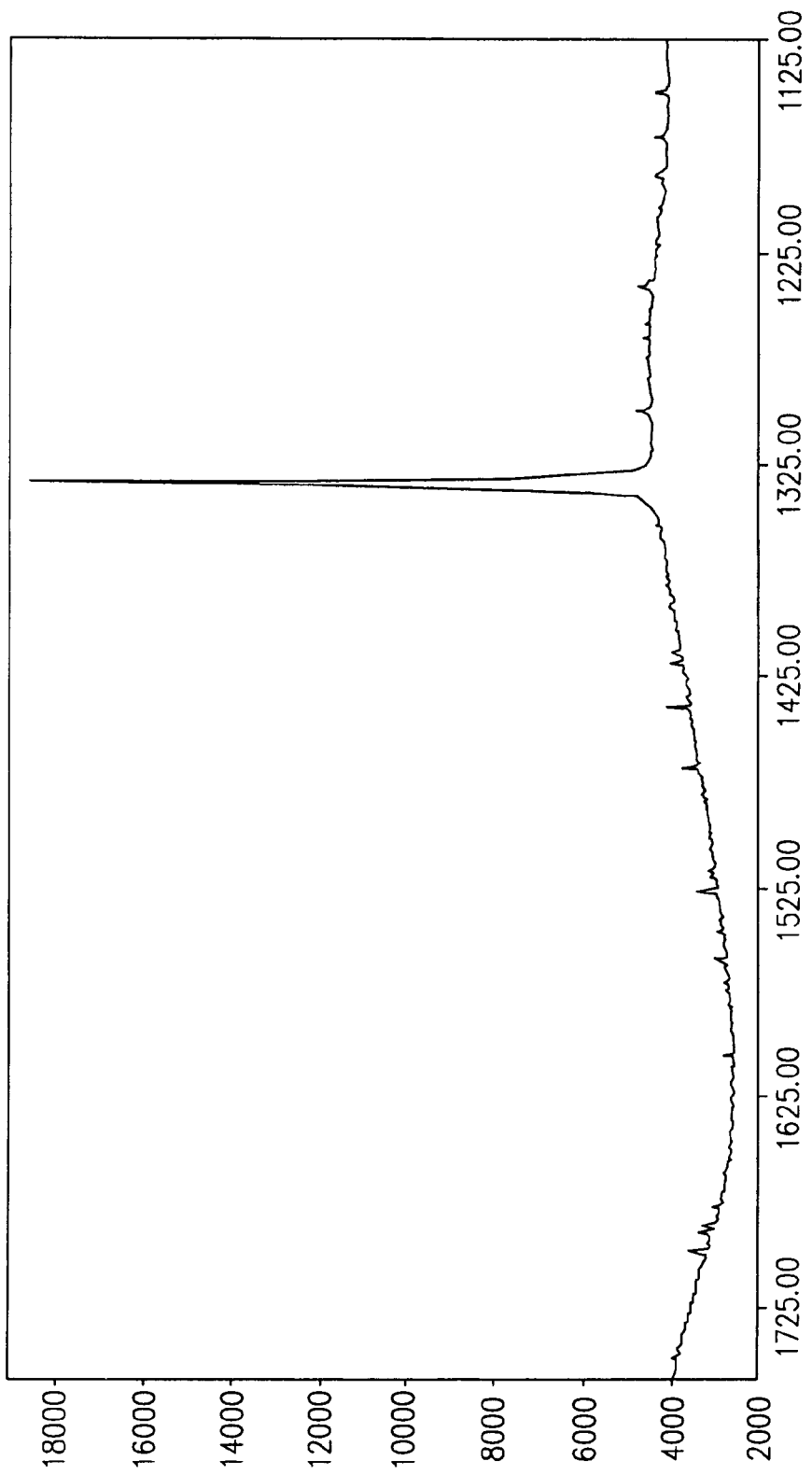
FIG. 4 is a characterization of Diamond Coatings by Raman Spectroscopy indicating the presence of a diamond deposited for 45 minutes at 150° C. on a polymer with well-defined single sharp peak at 1332 cm$^{-1}$ To facilitate understanding, identical reference numerals have been used, where possible, to designate identical elements that are common to the figures.

It should be emphasized that our primary claim is a method for the manufacturing of tightly adhering high-quality diamond coatings at low temperatures and low pressure on a substrate, utilizing; a graphite rod wrapped in a high-melting metal wire and substrate into a chamber; alternately reducing the pressure in the chamber to a vacuum and backfilling to about 1 atmosphere with hydrogen; backfilling the chamber with hydrogen gas below 1 atmosphere and sealing the chamber; and applying electric current to the graphite rod until the substrate is heated to within a range of 125° C. to 750° C. An example of the high quality of diamond coatings manufactured from this method can be seen in Raman spectra in FIG. 4, where a single sharp peak occurs at 1332 cm$^{-1}$ indicating a diamond structure. The diamond was deposited for 45 minutes at 150° C. on polymer substrate.

Depending on the application, the diamond may be present as discrete crystal grains, clusters of crystals, or continuous films. The particular coating technique described here is primarily intended to illustrate that such deposition is possible. It is likely that other deposition techniques or conditions can be developed that will produce diamond coatings at low temperature.

The invention has been described with reference to a preferred embodiment. However, it will be appreciated that a person of ordinary skill in the art, can effect variations and modifications without departing from the scope of the invention.

PARTS LIST

10 Step A
20 Step B
30 Step C
40 Step D
50 Step E
100 Graphite rod
110 High-melting metal wire
120 Substrate
125 Flexible substrate
130 Thermocouple
140 Graphite feed-through poles
150 Variable voltage power supply leads
160 Height adjusting device
170 Substrate holder
180 Substrate height adjustment pole
190 Thermocouple holder
200 Rubber O-ring

210 Chamber cover
220 Chamber bolts
230 Cooling water hose
240 Hydrogen tube
250 Air tube
260 Vacuum tube
300 Roll-to-roll holder
310 Roll-to-roll case holder
400 Single wire-wrapped graphite assembly component

What is claimed is:

1. A method for forming a diamond coating on a substrate in a sealed chamber, comprising the steps of:
    combining a graphite rod and a catalytic metal wire to form a graphite assembly, wherein the catalytic metal wire is wrapped around the graphite rod the metal wire in combination with the graphite rod promoting chemical reactions needed for diamond deposition, and placing the substrate and the combined graphite rod and catalytic metal wire into a chamber;
    filling the chamber with hydrogen;
    reducing ambient pressure in the chamber below 1 atmosphere;
    sealing the chamber such that the ambient pressure in the chamber remains below 1 atmosphere and the hydrogen is contained within the sealed chamber and there is no flow of gas in or out during diamond deposition; and
    passing electric current through the graphite rod until the substrate is heated within a range of 125° C.–750° C. thereby forming precursors for said diamond deposition and depositing diamond on said substrate.

2. The method claimed in claim 1, wherein the diamond coating manufactured is single crystalline diamond or polycrystalline diamond.

3. The method claimed in claim 1, wherein placement of the substrate relative to the graphite rod is determinative to the substrate having a desired temperature.

4. The method claimed in claim 2, wherein the substrate is perpendicular to the graphite rod.

5. The method claimed in claim 2, wherein the substrate is parallel to the graphite rod.

6. The method claimed in claim 2, further comprising the step of varying distance between the substrate and the graphite rod to vary the temperature of the substrate.

7. The method claimed in claim 1, wherein the diamond coating is formed on the substrate at 125° C.–150° C.

8. The method claimed in claim 6, wherein the diamond coating is formed on the substrate at 125° C.–150° C. within 30–60 minutes.

9. The method claimed in claim 1, wherein the substrate is selected from the group consisting of semiconductors, polymers, metals, glass and quartz.

* * * * *